United States Patent [19]

Guo et al.

[11] Patent Number: 5,381,438
[45] Date of Patent: Jan. 10, 1995

[54] LASER DIODE UNIT INCLUDING AN ADJUSTING MEMBER PROVIDED WITH A THROUGH HOLE

[75] Inventors: Shi-Pung Guo; Chuan-Yuan Chung, both of Hsinchu, Taiwan, Prov. of China

[73] Assignee: Industrial Technology Research Institute, Taiwan, Prov. of China

[21] Appl. No.: 111,917

[22] Filed: Aug. 26, 1993

[51] Int. Cl.6 ................................................ H01S 3/04
[52] U.S. Cl. ........................... 372/107; 372/50; 372/101; 372/36; 372/108
[58] Field of Search ............... 372/107, 108, 99, 98, 372/50, 101, 103, 36; 219/121.63, 121.74, 121.75, 121.81

[56] References Cited

U.S. PATENT DOCUMENTS

| | | | |
|---|---|---|---|
| 4,048,050 | 9/1991 | Komurasaki | 372/101 |
| 4,498,737 | 2/1985 | Doggett | 359/641 |
| 4,661,959 | 4/1987 | Kaneko | 372/107 |
| 4,701,929 | 10/1987 | Baer et al. | 372/71 |
| 4,753,510 | 6/1988 | Sezerman | 385/61 |
| 4,769,824 | 9/1988 | Seki | 372/107 X |
| 4,776,663 | 10/1988 | Malinge et al. | 385/79 |
| 4,808,789 | 2/1989 | Muncheryan | 372/22 X |
| 4,918,702 | 4/1990 | Kimura | 372/107 X |
| 4,926,433 | 5/1990 | Imamura et al. | 372/50 |
| 4,986,621 | 1/1991 | Gamerdinger | 385/56 |
| 5,200,965 | 4/1993 | Okuyama et al. | 372/107 X |

*Primary Examiner*—Rodney B. Bovernick
*Assistant Examiner*—Hemang Sanghavi
*Attorney, Agent, or Firm*—Michael D. Bednarek

[57] ABSTRACT

A laser diode unit, having advantages of dissipating heat quickly, being capable of protecting itself from being destroyed by an incidental electrostatic or electric voltage, being effective to deal with the operations of aligning, positioning, adjusting, and being easy to be mass-produced. The laser diode unit includes a laser diode element for emitting laser light beam; a mold housing for securing the laser diode element thereon, laser light beams emitting from the laser diode element being capable of penetrating the mold housing; a collimating lens set disposed within the mold housing for collimating the light of the laser beam emitting from the laser diode element; and an adjusting means for driving the collimating lens set to move to and fro within a through bore formed in the mold housing.

6 Claims, 4 Drawing Sheets

LASER DIODE UNIT INCLUDING AN ADJUSTING MEMBER PROVIDED WITH A THROUGH HOLE

BACKGROUND OF THE INVENTION

The present invention relates to a laser diode light source apparatus, particularly to that having advantages of dissipating heat quickly, being capable of protecting itself from being destroyed by an incidental electrostatic or electric voltage, being effective to deal with the operations of aligning, positioning, adjusting, and being effective to be mass-produced.

FIG. 1 is a cross-sectional view of a conventional laser diode light source apparatus. As shown in FIG. 1, a light beam 1a emitting from a laser diode element 1 passes through a collimating lens set 2 to form a parallel light beam 1b having its axis aligned with the optical axis 1c. A beam limitation plate 3 provided with a through hole having predetermined shape in circular or rectangular is disposed outside of the conventional laser diode light source apparatus so as to limit the size of the parallel light beam 1b. One set of screws 11 is used for securing the mold housing 7 of the laser diode light source apparatus 20 onto a side plate 30 of the optical system.

As shown in FIG. 1, the laser diode element 1 is disposed in a hole formed in the plastic mold piece 7. Due to inferior of thermal conductivity of plastic material, the heat generated by the laser diode element 1 is unable to be expelled during operation, and the laser diode element 1 is easy to burn out. In order to solve the heat dissipation problem, the outer shells for some kind of mold housings are made of aluminium alloy instead of plastic material. However, the laser diode element 1 is easy to be destroyed by an incidentally induced electrostatic or electric voltage conducted via aluminum shells.

Traditionally, the position of collimating lens set 2 is adjusted by shifting the collimating lens set 2 to and fro within a sleeve bore or screwing the collimating lens set 2 inward or outward along the threads formed on the outer peripheral of the collimating lens set 2 to obtain a parallel laser beam emitting from the light source apparatus. Since the parallel beam is sensitively affected by the location of the collimating lens set 2, it is hard to accurately adjust and locate the collimating lens set 2 on a given position. However, screwing the collimating lens set 2 may cause misalignment or tilt between the parallel light beam 1b and the optical axis 1c.

Furthermore, due to the fact that the beam limitation plate 3 is disposed outside of the mold housing 7, it is very hard to align the center of the through hole of the beam limitation plate 3 with the light axis 1c. Moreover, the mold housing 7 of a conventional laser diode light source apparatus 20 is usually secured on a side plate of an optical system 30 by means of screws. in order to have a good positioning in aligning laser light beam with the light axis 1c, the plastic injection mold for the mold housing 7 has to be manufactured in a high accuracy. Besides, as shown in FIG. 1, securing the laser diode light source apparatus 20 has to provide an opening in the side plate 30 of an optical system, and this will increase the cost of the mold manufacturing. In addition, screws 11 are easy to drop out from a screw driver during assembly of laser diode light source apparatus 20 with an optical system.

SUMMARY OF THE INVENTION

It is an object of the present invention to provide a laser diode light source apparatus capable of dissipating heat quickly and preventing itself from being destroyed by electric or electrostatic voltage.

It is another object of the present invention to provide a laser diode light source apparatus whose collimating lens set are easy to be adjusted.

It is still an object of the present invention to provide a laser diode light source apparatus having a beam limitation plate whose through hole is easy to be aligned with light axis.

It is still further an object of the present invention to provide a laser diode light source apparatus which is easy to be manufactured and assembled.

To achieve the above objects, a laser diode light source apparatus is provided. The laser diode light source apparatus includes: (a) a laser diode element for emitting laser light beams; (b) a mold housing provided with a first end having a first end surface, a second end having a second end surface, and a through bore passing through the mold housing, the laser diode element being secured on the first end surface, laser light beams emitting from the laser diode element and penetrating the second end surface by way of the through bore, the inner wall of the second end being provided with first screw threads; (c) a collimating lens set disposed within the through bore of the mold housing, for collimating the laser beam emitting from the laser diode element; and (d) an adjusting device. The adjusting device includes: a spring member restrained between said laser diode element and said collimating lens set, for urging the collimating lens away from the laser diode element, the spring member allowing the laser light beams emitting from the laser diode element passing therethrough; and an adjusting member provided with a through hole, second screw threads formed in the outer peripheral wall thereof, a first end portion, and a second end portion whose end surface being contacted with the collimating lens set, the first screw threads being meshed with the second screw threads so as to thrust the collimating lens set to move to and fro within the through bore by screwing the adjusting member in and out. Besides, the laser diode light source apparatus could be adjusted individually on a specific fixture to meet the specification of laser light source. Then, it is easy to position and secure this light source apparatus on the base of an optical system with less cost and work.

BRIEF DESCRIPTION OF THE DRAWINGS

The present invention can be better understood by the illustration of a preferred embodiment with reference to the accompanying drawings described hereinafter.

DETAILED DESCRIPTION OF THE PREFERRED EMBODIMENTS

Figure 1:
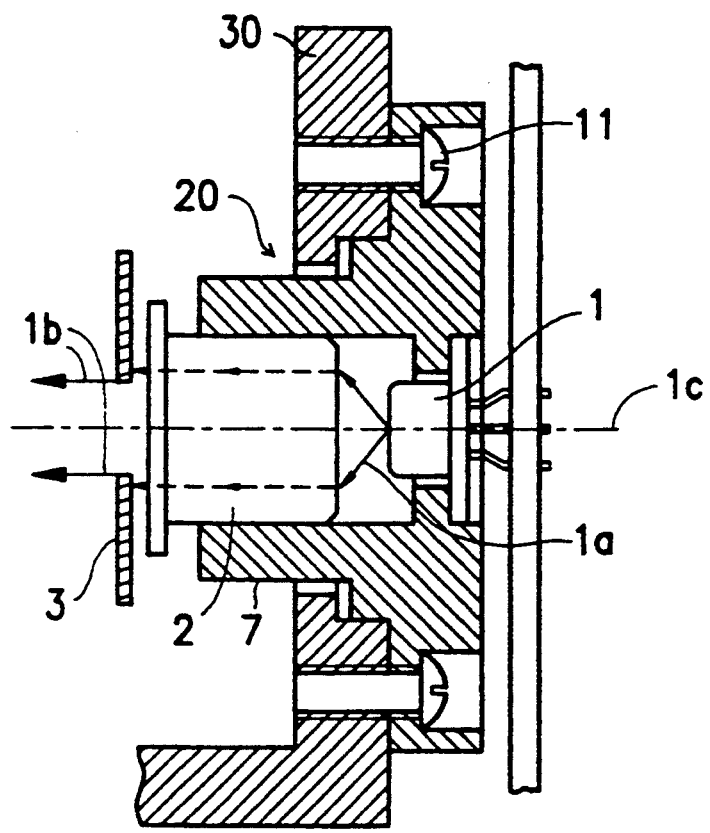
FIG. 1 is a cross-sectional view showing the structure of a conventional laser diode light source apparatus.
Figure 2:
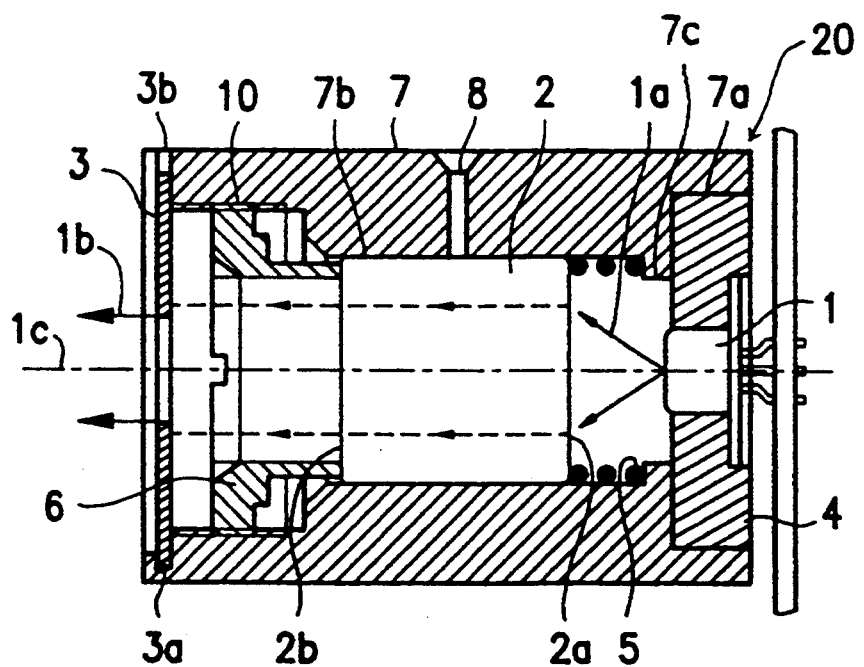
FIG. 2 is a cross-sectional view showing the structure of a preferred embodiment of the laser diode light source apparatus according to the present invention.
Figure 3:
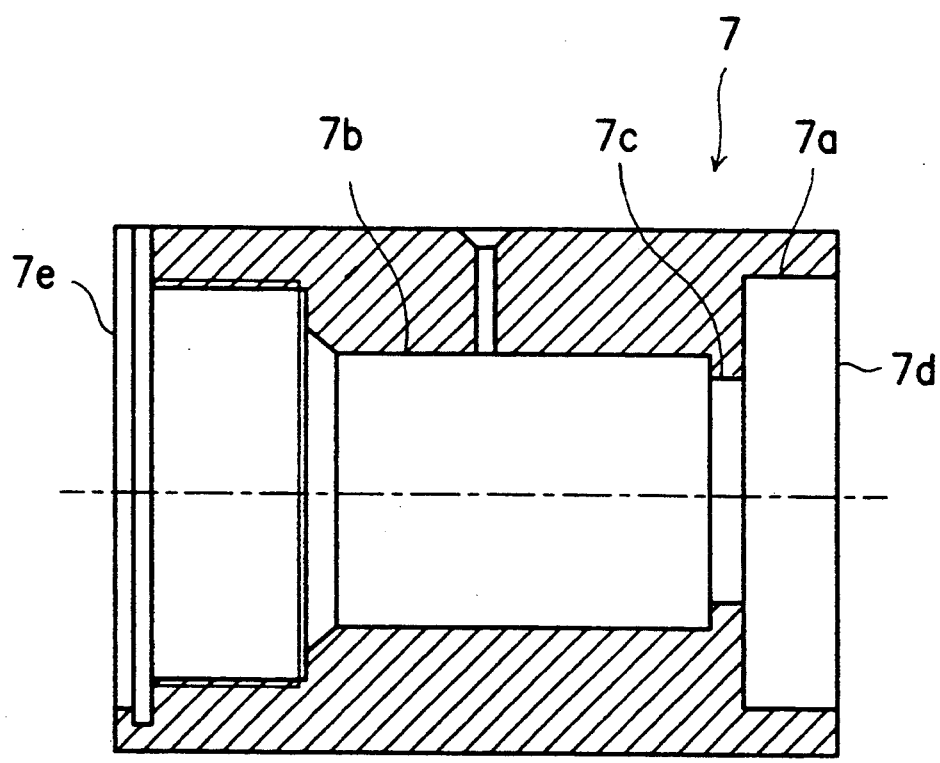
FIG. 3 is a cross-sectional view showing the housing of the laser diode light source apparatus shown in FIG. 2.

For the simplicity of explanation, similar parts appeared in FIG. 1, FIG. 2, FIG. 5, and FIG. 6 are assigned to same reference numerals. In FIG. 2, numeral 1 denotes a laser diode element; numeral 2 denotes a collimating lens set; numeral 3 denotes a limitation plate having a through hole at the center thereof; numeral 4 denotes a metal inserted casing; numeral 5 denotes a spring; numeral 6 denotes an adjusting member; numeral 7 denotes a mold housing, numerals 7a, 7b, and 7c denote, respectively, a first bore, a second bore, and a third bore formed in the mold housing 7; numerals 7d and 7e denote, respectively, the first end surface and the second surface of the mold housing. Numeral 8 denotes a glue injection hole; numeral 9 denotes indications formed at the head of the adjusting member 6; numeral 10 denotes the screw threads formed in the adjusting member; numeral 20 denotes the light source apparatus; numeral 1a denotes the light beam emitted from the laser diode element 1; numeral 1b denotes the parallel light beam generated by collimating lens set 2; numeral 1c denotes the light axis of the light source; numeral 3b denotes a slot formed in the mold housing, for accommodating and positioning the beam limitation plate 3, and numeral 3a denotes the bottom surface of the slot 3b, for positioning the beam limitation plate 3 into its place.

As shown in FIG. 2, the laser diode element 1 is secured within a metal inserted casing 4, and the metal inserted casing 4 is disposed in the first bore 7a so as to keep the laser diode element 1 in alignment with the light axis 1c. Since the mold housing 7 is made of an electric insulation material and metal inserted casing 4 is a heat-conductible material, the light source apparatus 20 is capable of preventing the laser diode element 1 from being destroyed by electrostatic or electric voltage and dissipating heat during its operation.

The second bore 7b is formed substantially concentric to the laser diode element 1 and the collimating lens set 2 is disposed within the second bore 7b. By this, the collimating lens set 2 is capable of being aligned with the light axis 1c. When the adjusting member 6 is screwed in or out, the collimating lens set 2 will be thrusted to move along the light axis 1c so as to adjust the light beam 1b passing through the collimating lens set 2 to be a parallel light beam. When a parallel light is emitting from the light source apparatus 20, glue is injected into the injection hole 8 to fix the collimating lens set 2. Thus, the collimating lens set 2 is accurately adjusted and fixed to its proper location.

In order to align the center of the through hole of the beam limitation plate 3 with the light axis 1c, the slot 3b is provided. When the beam limitation plate 3 is inserted and the end of the plate coincide with the bottom surface 3a of the slot 3b, the center of the through hole of the beam limitation plate 3 is certainly in alignment with the light axis 1c.

Figure 5:
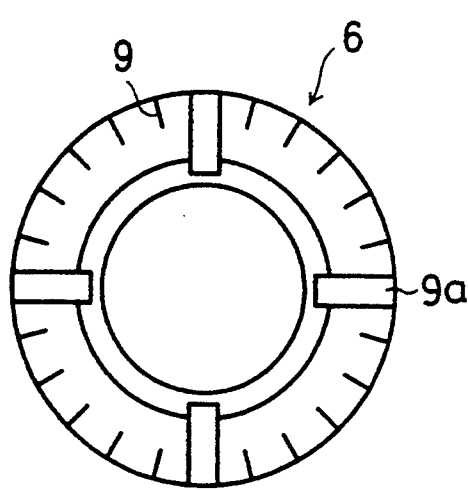
FIG. 5 is a front view of the adjusting member shown in FIG. 4.
Figure 4:
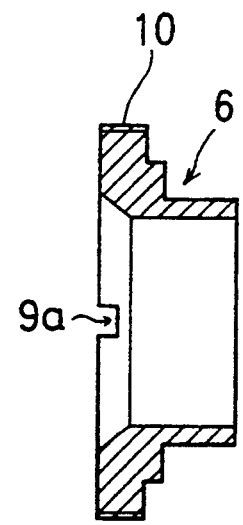
FIG. 4 is a cross-sectional view showing the structure of the adjusting member of the laser diode light source apparatus shown in FIG. 2.

A cross-sectional view of the adjusting member 6 of the laser diode light source apparatus according to this invention is shown in FIG. 4, and the front view of the adjusting member 6 is shown in FIG. 5. For the calculation of the displacement of the collimating lens set 2 within the second bore 7b, the head of the adjusting member 6 is provided with the indications 9. The displacement of the collimating lens set 2 can be calculated by the aid of the pitch of the screw threads 10 formed in the adjusting member 6.

Assuming that the circumference of the head of the adjusting member 6 is divided into n equal divisions by the indications 9 and the pitch of the screw threads 10 is P, then regulating one of the indications 9 will produce a displacement X of the collimating lens set 2, wherein $X = P*(1/n)$.

It should be noted that the plurality of slots 9a are formed at the head of the adjusting member 6 so as to facilitate the screwing operation of the adjusting member.

Figure 6:
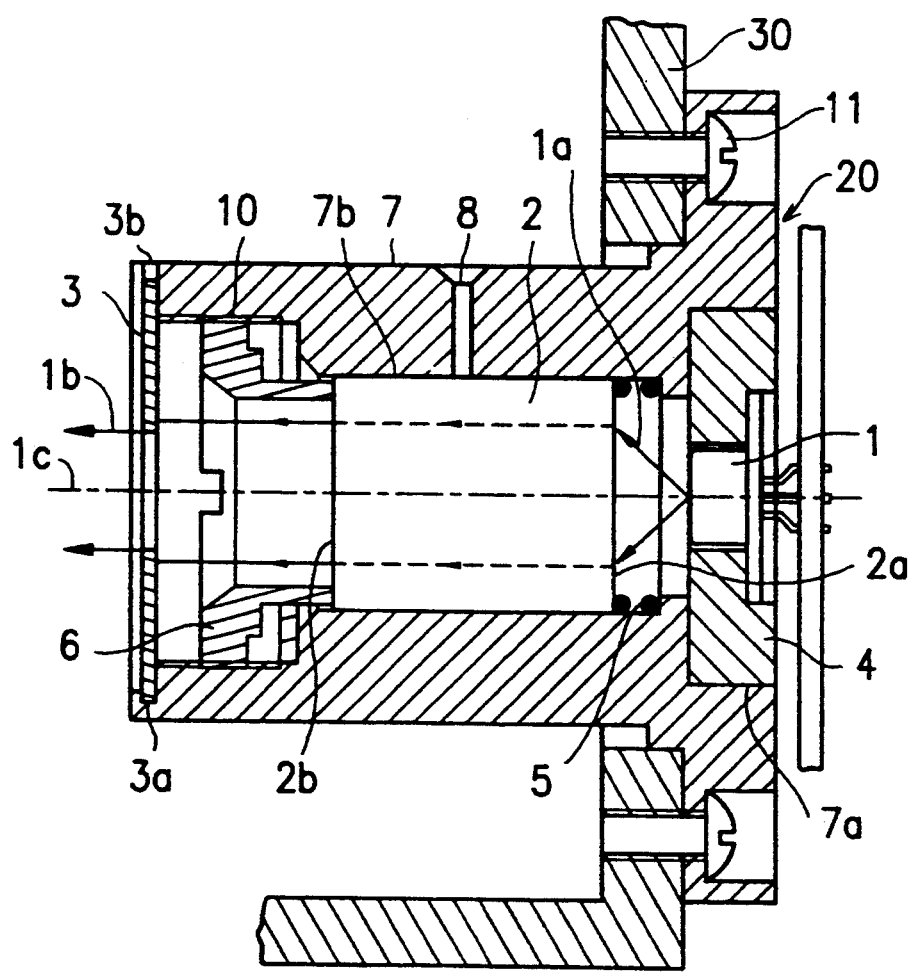
FIG. 6 is a cross-sectional view showing the status of the laser diode light source apparatus shown in FIG. 2, which is mounted on a side plate of an optical system.
Figure 7:
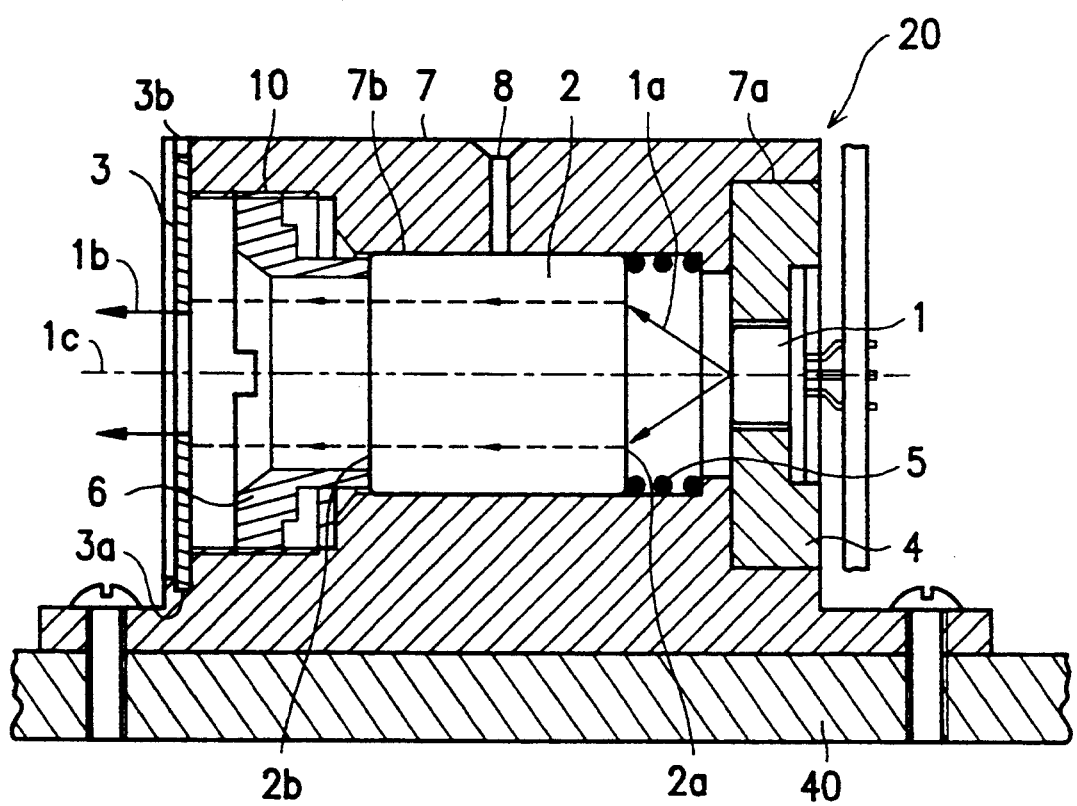
FIG. 7 is a cross-sectional view of the laser diode light source apparatus shown in FIG. 2, which is mounted on a base of an optical system.

Moreover, the laser diode light source apparatus of the present invention is capable of being secured on a side plate 30 of an optical system (as shown in FIG. 6) or on a base 40 of an optical system (as shown in FIG. 7). Securing the laser diode light source apparatus 20 on a base of an optical system will save the cost of plastic mode and facilitate positioning and assembling when fastening it.

As described above, the laser diode light source apparatus of the present invention is capable of dissipating heat quickly and preventing itself from being destroyed by electrostatic or electric voltage. Furthermore, the laser light source apparatus of the present invention is provided with the adjusting member 6, the spring 5, and the glue injection hole 8, thus the collimating lens set 2 is capable of being adjusted to its proper location in an easy way. Furthermore, slot 3b is provided for positioning the beam limitation plate 3, thus the through hole of the beam limitation plate 3 can be aligned with the light axis 1c quickly. In addition, the laser diode light source apparatus of the present invention is capable of being secured on a base of an optical system, thus the cost of the plastics molds can be reduced and the precisely assembling of the laser diode light source apparatus can be easily carried out.

Although the present invention has been disclosed hereinbefore by way of preferred embodiments, it should be understood that various changes or modifications are still possible by those skilled in the art without departing from the spirit and scope of the present invention. The protection scope of the present invention should be regarded as claims described hereinafter.

What is claimed is:

1. A laser diode unit, comprising:
   (a) a laser diode element for emitting laser light beams;
   (b) a metal inserted casing for accommodating said laser diode element therewithin, wherein said laser diode element is accommodated within said metal inserted casing with a substantial contact area between a surface of said laser diode element and said metal inserted casing to enhance heat dissipation from said laser diode element;
   (c) a mold housing provided with a first end having a first end surface, a second end having a second end surface, and a through bore passing through said mold housing, said metal inserted casing being secured on the first end surface, laser light beams emitting from said laser diode element being capable of penetrating the second end surface via the through bore, the inner wall of the second end being provided with first screw threads;

(d) a collimating lens set disposed within the through bore of said mold housing, for collimating the laser light beams emitting from said laser diode element;

(e) a spring member restrained between said laser diode element and said collimating lens set, for urging said collimating lens set away from said laser diode element, said spring member allowing the laser light beams emitting from said laser diode element to pass therethrough; and (f) an adjusting member provided with a through hole, second screw threads formed in the outer peripheral wall of said adjusting member, said adjusting member having a first end portion, and a second end portion whose end surface is contacted with said collimating lens set, the first screw threads being meshed with the second screw threads so as to thrust said collimating lens set to move to and fro within the through bore by screwing said adjusting member in and out; wherein said mold housing is provided with a glue injection hole communicating with the through bore, for the injection of glue into the through bore to stick said collimating lens set firmly to the inner wall of the through bore on a proper position.

2. A laser diode unit as claimed in claim 1, wherein the end surface of the first end portion of said adjusting member is provided with indications denoting the turns advanced of said adjusting member.

3. A laser diode unit as claimed in claim 2, wherein the end surface of the first end portion of said adjusting member is provided with a plurality of slots for facilitating the screwing operation of said adjusting member.

4. A laser diode unit as claimed in claim 1, wherein said mold housing includes mounting means for fastening said unit to a base of an optical system.

5. A laser diode unit as claimed in claim 1, wherein said through hole in said adjusting member is coaxial with said collimating lens set.

6. A laser diode unit as claimed in claim 1, wherein said through bore of said mold housing, said through hole in said adjusting member, said collimating lens set, and said spring member are all coaxial with a laser light beam emitted from said laser diode element.

* * * * *

UNITED STATES PATENT AND TRADEMARK OFFICE
CERTIFICATE OF CORRECTION

PATENT NO. : 5,381,438
DATED : January 10, 1995
INVENTOR(S) : Shi-Pung GUO, et al.

It is certified that error appears in the above-indentified patent and that said Letters Patent is hereby corrected as shown below:

On the title page, item [75], change "Prov." to --Republic--.

Signed and Sealed this

Twenty-third Day of May, 1995

Attest:

BRUCE LEHMAN

*Attesting Officer*     *Commissioner of Patents and Trademarks*